United States Patent [19]

Kosa et al.

[11] Patent Number: 5,739,564
[45] Date of Patent: Apr. 14, 1998

[54] SEMICONDUCTOR DEVICE HAVING A STATIC-RANDOM-ACCESS MEMORY CELL

[75] Inventors: Yasunobu Kosa; Howard C. Kirsch; Thomas F. McNelly; Frank Kelsey Baker, all of Austin, Tex.

[73] Assignee: Motorola, Inc., Schaumburg, Ill.

[21] Appl. No.: 460,605

[22] Filed: Jun. 1, 1995

Related U.S. Application Data

[62] Division of Ser. No. 345,891, Nov. 28, 1994, Pat. No. 5,536,674, which is a continuation of Ser. No. 989,425, Dec. 11, 1992, abandoned.

[51] Int. Cl.$^6$ .......................... H01L 21/265; H01L 21/70
[52] U.S. Cl. .......................... 257/298; 257/306; 257/532
[58] Field of Search ............................ 257/306, 298, 257/904, 906, 532

[56] References Cited

U.S. PATENT DOCUMENTS

| | | | |
|---|---|---|---|
| 4,532,609 | 7/1985 | Iizuka | 365/154 |
| 4,535,426 | 8/1985 | Ariizumi et al. | 365/182 |
| 4,590,508 | 5/1986 | Hirakawa et al. | 357/41 |
| 4,679,171 | 7/1987 | Logwood et al. | 365/154 |
| 4,725,981 | 2/1988 | Rutledge | 365/154 |
| 4,780,751 | 10/1988 | Nishimoto | 357/23.6 |
| 4,805,147 | 2/1989 | Yamanaka et al. | 365/154 |
| 4,805,148 | 2/1989 | Diehl-Nagle et al. | 365/154 |
| 4,879,690 | 11/1989 | Anami et al. | 365/201 |
| 4,980,732 | 12/1990 | Okazawa | 357/23.5 |
| 4,984,200 | 1/1991 | Saitoo et al. | 365/154 |
| 5,073,510 | 12/1991 | Kwon et al. | 437/40 |
| 5,132,771 | 7/1992 | Yamanaka et al. | 357/59 |
| 5,135,881 | 8/1992 | Saeki | 437/52 |
| 5,135,882 | 8/1992 | Karniewicz | 437/52 |
| 5,145,799 | 9/1992 | Rodder | 437/47 |
| 5,179,033 | 1/1993 | Adan | 437/41 |
| 5,218,511 | 6/1993 | Nariani | 361/313 |
| 5,229,310 | 7/1993 | Sivan | 437/41 |
| 5,239,196 | 8/1993 | Ikeda et al. | 257/385 |

FOREIGN PATENT DOCUMENTS

| | | | |
|---|---|---|---|
| 475 688 | 3/1992 | European Pat. Off. | 257/904 |
| 2-199871 | 8/1990 | Japan | 257/904 |

OTHER PUBLICATIONS

Itabashi, et al.; "A Split Wordline Cell for 16Mb SRAM Using Polysilicon Sidewall Contacts"; IEDM; pp. 477–480 (1991).

Yamanaka, et al.; "A 25 um2, New Poly–Si PMOS Load (PPL) SRAM Cell Having Excellent Soft Error Immunity"; IEDM; pp. 48–51 (1988).

Chappell, et al.; "Stability and SER Analysis of Static RAM Cells"; IEEE Transactoins on Electron Devices, vol. ED–32, No. 2; pp. 463–470 (1985).

Wang; "High Performance, High Density Capacitively Loaded FET Static RAM"; IBM Technical Disclosure Bulletin; vol. 27, No. 4A; pp. 1950–1951 (1984).

Primary Examiner—Donald Monin
Attorney, Agent, or Firm—George R. Meyer

[57] ABSTRACT

A static-random-access memory cell comprising floating node capacitors is disclosed. In one embodiment, the storage nodes acts as the first plates for the floating node capacitors, and a conductive member acts as the second plates for the floating node capacitors. The conductive member also electrically connects the second plates together, but is not electrically connected to other parts of the memory cell. In another embodiment, a conductive member acts as the second plates of a plurality of memory cells. The conductive member also electrically connects the second plates together, but is not electrically connected to other parts of the memory cells. Processes for forming the memory cells is also disclosed.

20 Claims, 7 Drawing Sheets

SEMICONDUCTOR DEVICE HAVING A STATIC-RANDOM-ACCESS MEMORY CELL

This is a divisional of patent application Ser. No. 08/345,891, filed Nov. 28, 1994 now U.S. Pat. No. 5,536,674, which is a continuation of patent application Ser. No. 07/989,425, filed Dec. 11, 1992, now abandoned.

RELATED APPLICATION

This is related to U.S. patent application Ser. No. 07/990,341 now U.S. Pat. No. 5,377,139 filed Dec. 11, 1992.

FIELD OF THE INVENTION

The present invention relates to the field of semiconductor devices, and in particular, to static-random-access memory cells.

BACKGROUND OF THE INVENTION

Within integrated circuits, semiconductor devices such as memory cells including their components are becoming smaller. The smaller components are needed in a memory cell such as those in a static-random-access memory (SRAM). As the size of a SRAM cell decreases, the operational speed of the SRAM typically increases, the power consumption typically decreases, and yields generally increase. Still, the smaller SRAM cell has its problems. The amount of charge at a storage node is about the product of the capacitance of the storage node and the voltage difference between the plates of the storage node capacitor. The smaller SRAM cell typically has less capacitance because the area of the storage node capacitor typically decreases with the SRAM cell size. The decrease in capacitance may allow alpha particles to cause soft errors.

Incorporating additional capacitors within a SRAM cell is one way to increase the storage node capacitance, which typically reduces the soft error rate of the SRAM cell. Capacitors that are connected to the storage nodes are discussed in many patents and technical articles. A dynamic-random-access memory (DRAM) typically has a storage capacitor such as a fin capacitor. Many DRAM storage capacitors including fin capacitors are complex and would require many additional processing steps to an existing SRAM process. In another attempt to reduce soft error rates, a SRAM cell may have its storage nodes capacitively coupled a relatively constant voltage supply such as $V_{SS}$, $V_{DD}$, or a fraction of $V_{DD}$. The capacitor plates, which are connected to the relatively constant voltage, may need additional contact openings or a specialized interconnecting layer in addition to the layer used to form one of the plates of the capacitor.

SUMMARY OF THE INVENTION

The present invention includes a static-random-access memory cell comprising 1) a first storage node having a first capacitor section; 2) a second storage node having a second capacitor section; 3) a first capacitor having a first plate and a second plate; and 4) a second capacitor having a first plate and a second plate. The first capacitor section of the first storage node acts as the first plate of the first capacitor, and the second capacitor section of the second storage node acts as the first plate of the second capacitor. The second plates of the first and second capacitors are electrically connected only to each other. The present invention also includes another embodiment, wherein the second plates of a plurality of memory cells are electrically connected together. The present invention includes processes for forming the memory cells.

The present invention includes benefits as seen in conjunction with the first embodiment. One of the capacitors within the memory cell may fail as an electrical open or short and the memory cell remains operational. In fact, both capadtors may fail as electrical opens, and the memory cell is still operational. The capacitors are easy to form and typically do not cause the topography or layout of the memory cell to be significantly changed. Still another advantage of the present invention is that the potential of the floating node is about halfway between the potentials of the two storage nodes of the SRAM cell. This feature limits the electric field applied across each floating node capacitor, allowing the dielectric layer of each floating node capacitor to be thinner and more reliable.

Other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

The present invention includes a static-random-access memory cell comprising floating node capacitors. In one embodiment, the storage nodes acts as the first plates for the floating node capacitors, and a conductive member acts as the second plates for the floating node capacitors. The conductive member also electrically connects the second plates together, but is not electrically connected to other parts of the memory cell. The present invention also includes another embodiment, wherein a conductive member acts as the second plates of a plurality of memory cells. The conductive member also electrically connects the second plates together, but is not electrically connected to other parts of the memory cells. The present invention includes processes for forming the memory cells.

The present invention includes benefits as seen in conjunction with the first embodiment. One of the capacitors within the memory cell may fail as an electrical open or short and the memory cell remains operational. In fact, both capacitors may fail as electrical opens, and the memory cell is still operational. The capacitors are easy to form and typically do not cause the topography of the memory cell to be significantly changed. Still another advantage of the present invention is that the potential of the floating node is about halfway between the potentials, which allows a thinner and more reliable dielectric layer to be used within each of the floating node capacitors.

EXAMPLE

Figure 1:
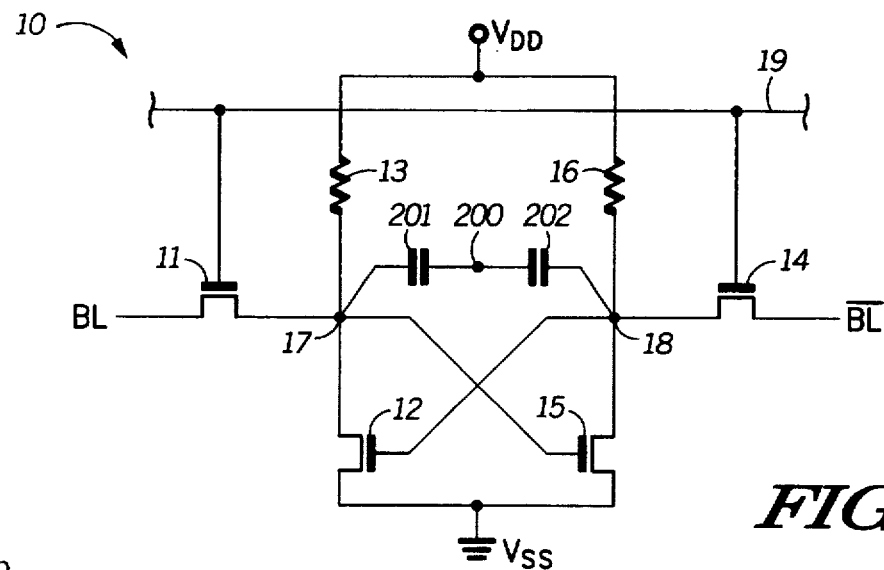
FIG. 1 includes a circuit diagram of a four-transistor static-random-access memory cell including floating node capacitors formed in accordance with an embodiment of the present invention.

FIG. 1 includes a circuit diagram of a four-transistor static-random-access memory cell 10 formed in accordance with an embodiment of the present invention. The memory cell 10 includes a first storage node 17, a second storage node 18, and a floating node 200. A first pass transistor 11, a first latch transistor 12, and a first load resistor 13 are associated with the first storage node 17, and a second pass transistor 14, a second latch transistor 15, and a second load resistor 16 are associated with the second storage node 18. The gate electrode for the first latch transistor 12 is electrically connected to the second storage node 18, and the gate electrode for the second latch transistor 15 is electrically connected to the first storage node 17. The gate electrodes for the pass transistors 11 and 14 are part of a word line 19. A source/drain region of the first pass transistor 11 is connected to a first bit line, and a source/drain region of the second pass transistor 14 is connected to a second bit line. The source regions of the latch transistors 12 and 15 are electrically connected to one another and to a $V_{SS}$ electrode, which is at about ground potential when the memory cell is operating. The electrode regions of the load resistors 13 and 16 are electrically connected to one another and to a $V_{DD}$ electrode, which is at a potential in a range of about 2–5 volts when the memory cell is operating.

Unlike prior art static-random-access memory cells, the first and second storage nodes are connected to one another via a pair of floating node capacitors 201 and 202. The first capacitor 201 has a first capacitor plate electrically connected to the first storage node and a second capacitor plate electrically connected to the floating node 200. The second capacitor 202 has a first capacitor plate electrically connected to the second storage node and a second capacitor plate electrically connected to the floating node 200. The floating node 200 is not electrically connected to any other part of the memory cell 10. Therefore, the floating node 200 electrically floats at a potential that is between the potentials of the storage nodes 17 and 18.

Figure 2:
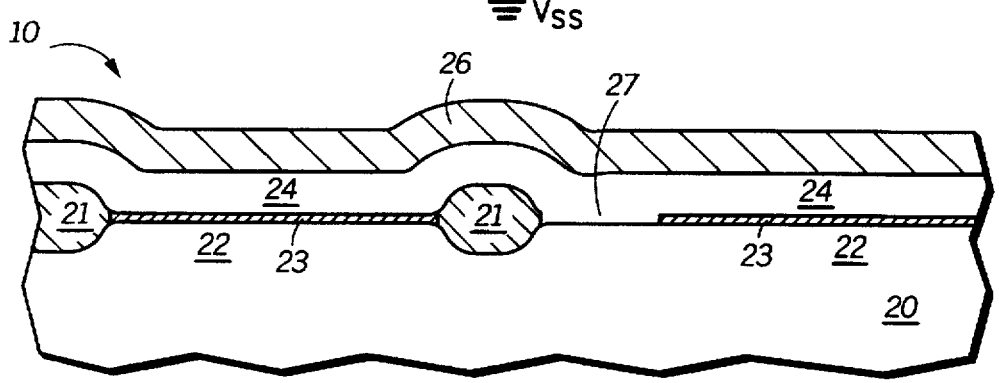
FIG. 2 includes a cross-sectional view of a portion of a substrate after forming a plurality of layers.

FIG. 2 includes a cross-sectional view of a portion of a lightly p-type doped monocrystalline silicon substrate (substrate) 20 generally illustrating the location where the SRAM memory cell 10 is formed. The memory cell 10 includes field isolation regions 21 and active regions 22 that lie within the substrate. Over the active regions 22 are a gate dielectric layer 23 comprising silicon dioxide and a gate dielectric layer opening 27, which is where a buried contact is subsequently formed. The memory cell further includes a first conductive layer 24 including n-type doped silicon and a first insulating layer 26 including silicon dioxide about 2200 angstroms thick. The formation of the regions, openings, and layer of the memory cell 10 up to this point in the process are conventional.

The first conductive and the first insulating layers 24 and 26 are patterned in a self-aligned etching sequence including two steps to form latch gate electrodes and a word line as described below and illustrated in FIG. 3. A masking layer (not shown) is formed over the memory cell 10 and includes masking openings that expose portions of the first insulating layer 26. The first etch step etches the exposed portions of the first insulating layer 26 and exposes portions of the first conductive layer 24. The second etch step etches the exposed portions of the first conductive layer 24 to form latch gate electrodes 31 and a word line 32 and stops on the gate dielectric layer 23 or the field isolation regions 21. The etching sequence is performed using a conventional plasma etcher and anisotropic etch methods. One skilled in the art also appreciates that the patterning of the two layers may be performed during a plurality of separate etch sequences or using a plurality of etchers. The masking layer is removed after the etching sequence is performed.

Figure 3:
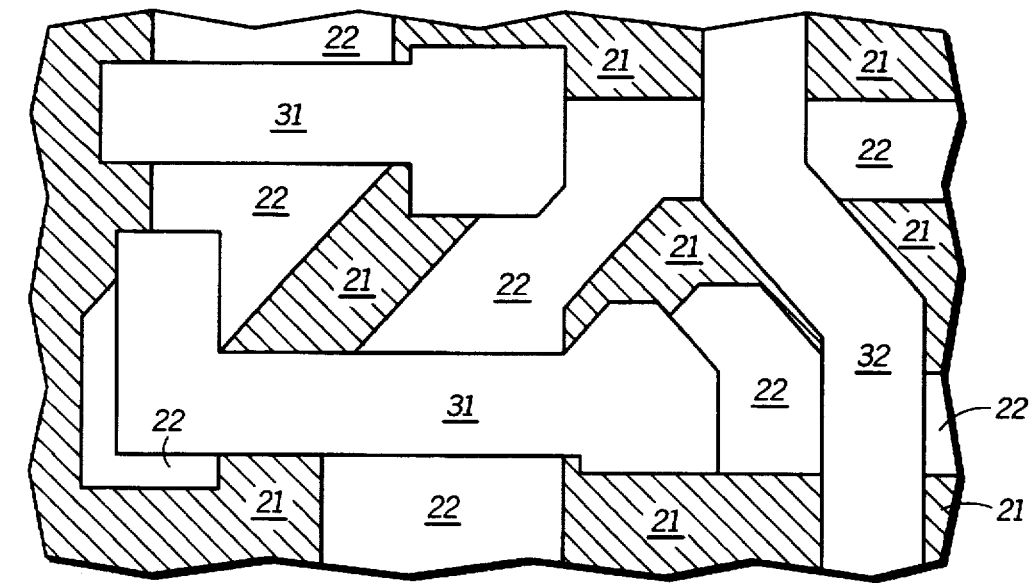
FIG. 3 includes a top view of the substrate of FIG. 2 after forming latch gate electrodes and a word line.

The positional relationship between many of the elements of the memory cell 10 at this stage of the processing is illustrated in FIG. 3. FIG. 3 and all of the other top views of this specification do not include the gate dielectric layer 23 and the first insulating layer 26. Each latch gate electrode 31 or the word line 32 comprises the first conductive layer 24 and is a conductive member. Each latch gate electrode 31 includes a main body section and a storage node section that includes a storage node area. As used in this specification, storage node area is defined as the memory cell area (as seen from a top view of the memory cell) occupied by a contact between 1) one section of a load resistor and one of the latch gate electrodes 31 or 2) a source or drain region of a load transistor and one of the latch gate electrodes 31. The main body sections of the latch gate electrodes 31 act as the gate electrodes for the latch transistors of the memory cell 10. Each storage node section of the latch gate electrodes 31 acts as a first capacitor plate. The word line 32 includes main body sections, each of which acts as a gate electrode for a pass transistor, and connecting sections, which lie adjacent to the main body sections and electrically connects the main body sections together to form the single continuous word line 32 for the memory cell 10.

Figure 4:
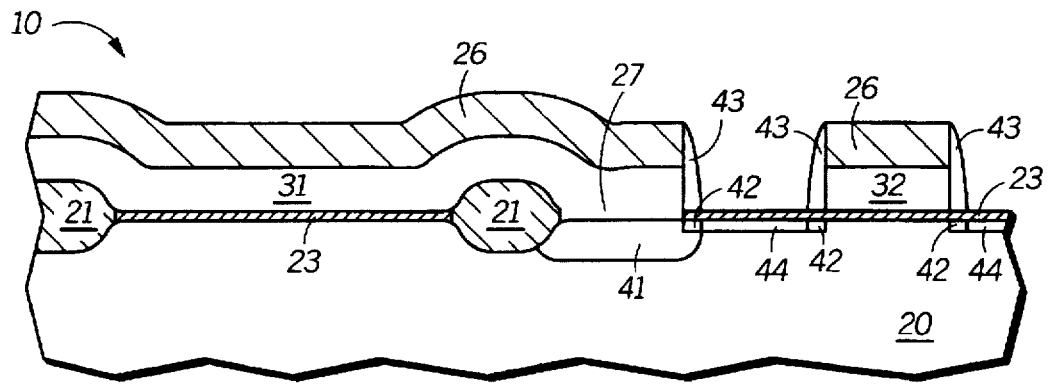
FIG. 4 includes a cross-sectional view of the substrate of FIG. 3 after forming sidewall spacers and doped regions within the substrate.

N-type regions 42 are formed by ion implanting an n-type dopant as shown in FIG. 4. The N-type regions 42 subsequently form lightly doped drain (LDD) regions of the pass and latch transistors. Sidewall spacers 43 are formed by depositing a layer of silicon nitride and anisotropically etching the silicon nitride using conventional methods. The memory cell is heavily doped with an n-type dopant to form heavily doped regions 44. Thermal cycles have caused dopant from the latch gate electrodes 31 to diffuse into the substrate to form buried contact regions 41, one of which is shown in FIG. 4.

Figure 5:
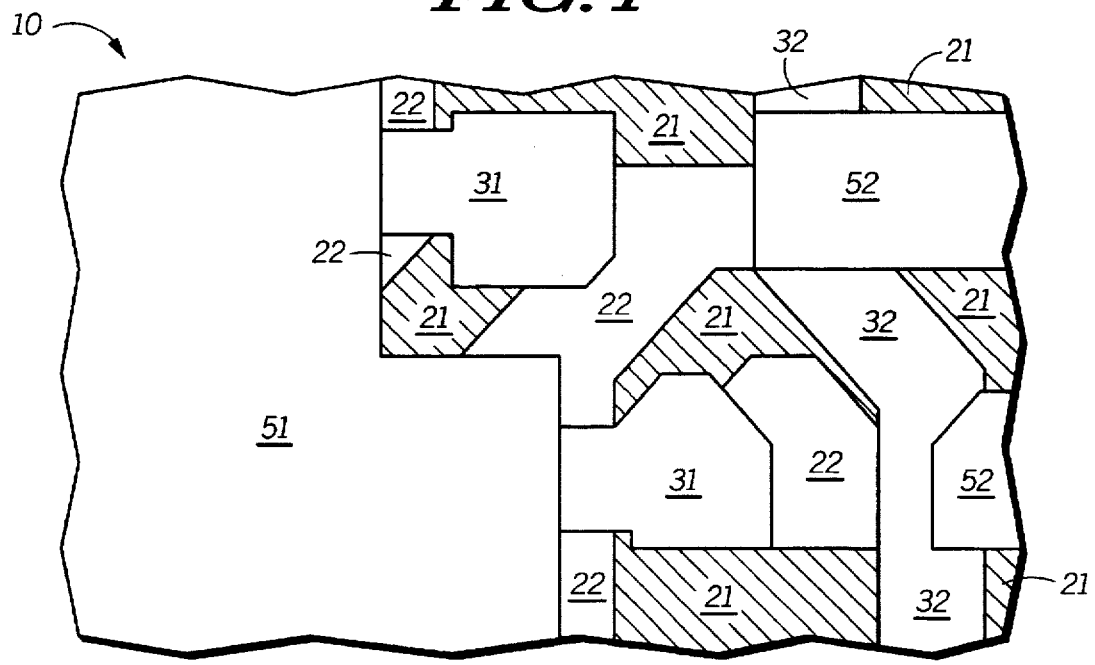
FIG. 5 includes a top view of the substrate of FIG. 4 after second conductive members have been formed.
Figure 6:
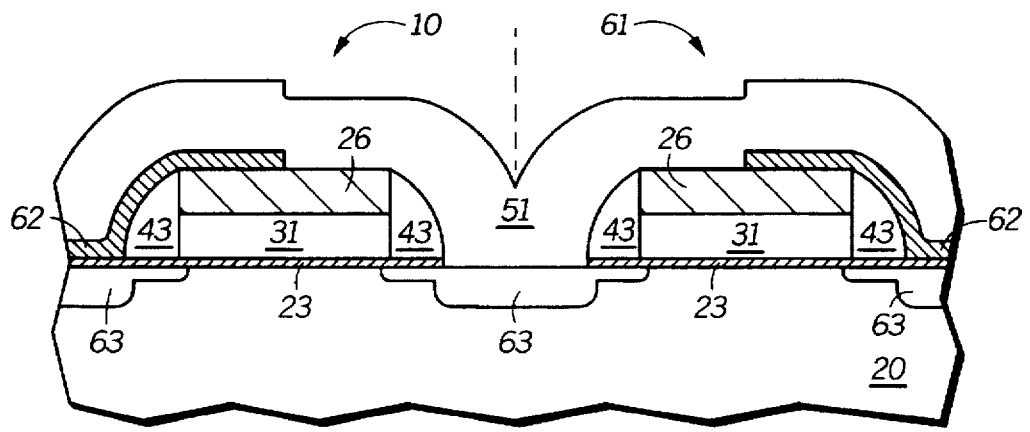
FIGS. 6 and 7 include cross-sectional views of the substrate of FIG. 5 each illustrating a second conductive member contacting doped regions within the substrate.
Figure 7:
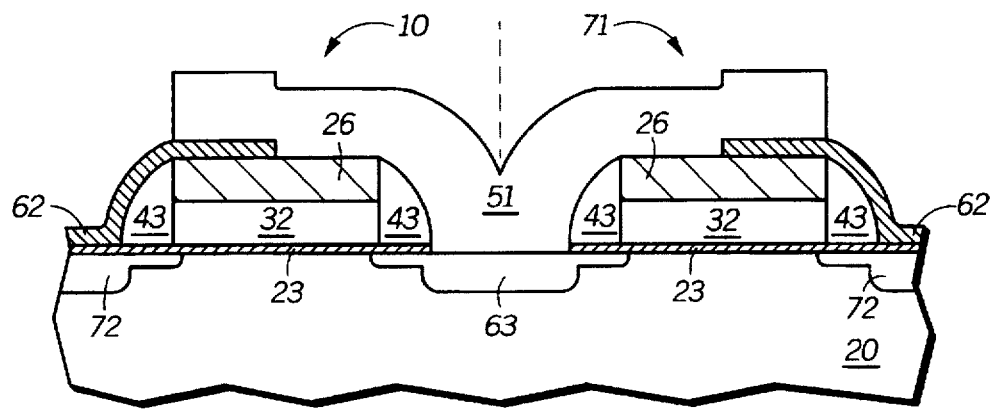

FIGS. 5–7 include illustrations of the memory cell after forming a couple of other layers. Below is a brief explanation of the steps involved. The subsequent paragraphs discuss the positional relationships between the layers in greater detail. A second insulating layer 62 is formed over the memory cell 10 by depositing about 1500 angstroms of silicon dioxide. The second insulating layer 62 is patterned using conventional methods to expose portions of the doped regions 63 that are adjacent to the latch gate electrodes 31 and portions of the doped regions 63 that are adjacent to the word line 32. A second conductive layer is formed and includes a heavily n-type doped silicon. A refractory-metal silicide layer is formed over and from a part of the second conductive layer. The second conductive and refractory silicide metal layer are patterned to form second conductive members 51 and 52, which include the patterned second conductive layer and the refractory-metal silicide layer. All steps performed within this paragraph are done using conventional methods.

Figure 8:
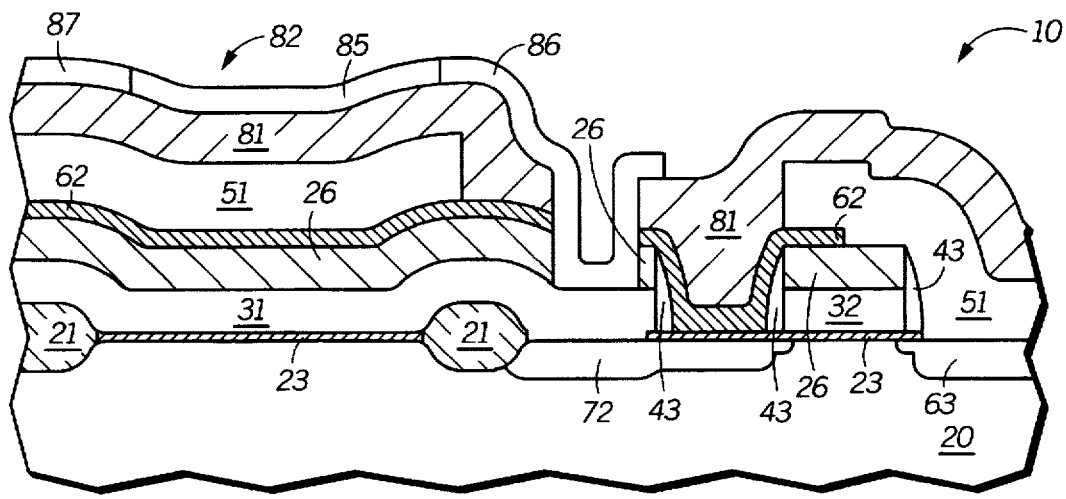
FIG. 8 includes a cross-sectional view of the substrate after patterning a load resistor layer.
Figure 9:
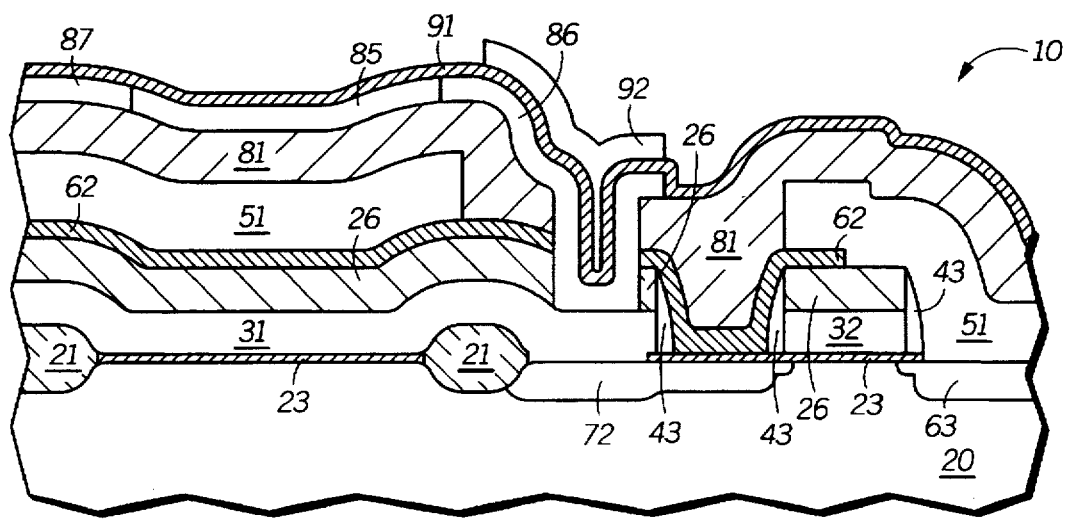
FIG. 9 includes a cross-sectional view of the substrate after forming second plates of floating storage node capacitors in accordance with an embodiment of the present invention.

FIG. 5 includes a top view of the memory cell 10, and FIGS. 6 and 7 are cross-sectional views through latch transistors and a bit line region, respectively. Thermal cycles since the time of forming the doped regions 42 and 44 have caused the doped regions to diffuse into one another to form doped regions 63 as seen in FIGS. 8 and 9. Similarly, buried contact region 41 and doped regions 42 and 44 have diffused together to form doped regions 72 in FIG. 7. FIG. 5 includes a top view of the memory cell 10 after forming the second conductive member 51 and 62 and illustrates the positional relationship between the second conductive members 51 and 52 and other regions of the memory cell 10.

FIG. 6 includes a cross-sectional view of the memory cell taken along a direction that is substantially perpendicular to the length of the latch gate electrodes 31. The memory cell 10 is typically one of a plurality of memory cells within a memory array. FIG. 6 also includes a portion of memory cell 61, which is a memory cell that is located above and adjacent to the memory cell 10 of FIG. 5. The memory cell 61 has a memory cell layout that is a mirror image of the memory cell 10. The second conductive member 51 contacts doped region 63, which acts as the source regions of the latch transistors shown in FIG. 6. The first insulating layer 26, sidewall spacers 43, and the second insulating layer 62 reduce the likelihood of forming electrical shorts between the second conductive member 51 and both the latch gate electrodes 31 and drain regions of the latch transistors. The first insulating layer 26, sidewall spacers 43, and the second insulating layer 62 also help to minimize capacitive coupling between the second conductive member 51 and both the latch gate electrodes 31 and drain regions, of the latch transistors. In FIG. 6, the drain regions of the latch transistors are doped regions 63 within the substrate 20 and are located along the opposing sides of the drawing.

FIG. 7 is similar to FIG. 6 in that it illustrates how a second conductive member contacts a doped region within the substrate 20. FIG. 7 includes a cross-sectional view of the memory cell taken along a direction that is substantially perpendicular to the length of the word line 32. FIG. 7 also includes a portion of memory cell 71, which is a memory cell that is located to the right of the memory cell 10 of FIG. 5. The memory cell 71 has a memory cell layout that is a mirror image of the memory cell 10. The second conductive member 52 contacts the doped region 63, which acts as the first source/drain regions of the pass transistors. The first insulating layer 26, sidewall spacers 43 and the second insulating layer 62 reduce the likelihood of forming electrical shorts between the second conductive member 52 and both the word lines 32. The first insulating layer 26, sidewall spacers 43 and the second insulating layer 62 also help to minimize the capacitive coupling between the second conductive member 52 and both the word lines 32. Similar structures are formed along other parts of the word lines 32 where bit line contacts are formed.

A third insulating layer 81 is formed by depositing about 2000 angstroms of silicon dioxide. An opening extends through the first, second, and third insulating layers 26, 62, and 81 to the latch gate electrode 31 as seen in FIG. 8.

Another opening similar to the opening of FIG. 8 is also formed within the memory cell 10. The openings expose the storage node areas for the storage nodes of the memory cell 10. The deposition of the third insulating layer 81 and the patterning of the first and third insulating layers 26 and 81 are performed using conventional methods. A load resistor layer 82 is formed by depositing a silicon layer and patterning it The load resistor includes three types of sections: resistor sections 85, storage node sections 86, and an electrode section 87. The thickness, length, width, and doping level of the resistor section generally determines the resistance of the load resistors 13 and 16. In this embodiment, the resistor sections 85 are lightly n-type doped and have a resistance on the order of gigaohms. The electrode section 87 is heavily doped to provide electrical contact to a $V_{DD}$ electrode, and the storage node sections 86 are heavily doped to provide electrical contact to the storage node areas of the storage node sections of the latch gate electrodes 31. FIG. 8 illustrates the second conductive member 51 lying on the first insulating layer 26. It is pointed out that the cross-sectional view in FIG. 8 is along that portion one of the latch gate electrodes 31, wherein the portion is closer to the doped region 63 that acts as a drain region for the latch gate electrode 31.

Referring to FIG. 9, an oxide-nitride-oxide (ONO) layer 91 is formed over the memory cell 10 by depositing about 30 angstroms of silicon dioxide using an ambient including tetraethylorthosilicate (TEOS), depositing about 150 angstroms of silicon nitride over the silicon dioxide, and annealing the deposited silicon nitride in an ambient including an oxidizing species that forms about 20 angstroms of silicon dioxide over the silicon nitride.

A layer of heavily n-type doped silicon is formed over the memory cell 10 and patterned to form a third conductive member 92. The third conductive member 92 includes second capacitor plate sections and a floating node section that lies adjacent and between the second capacitor plate sections. The third conductive member 92 is not electrically connected to any other part of the memory cell 10. Therefore, the third conductive member 92 electrically floats. The capacitors formed are hereinafter called "floating node capacitors" because the third conductive member electrically floats at a potential that is between the potentials of the storage nodes 17 and 18. The third conductive member 92 typically lies over the storage node sections 86, but the third conductive member 92 typically does not lie over the resistor sections 85 or the electrode section 87. The storage node sections 86 act as the first plates of the floating node capacitors, and the capacitor plate sections of the third conductive members 92 act as the second plates of the floating node capacitors.

Figure 10:
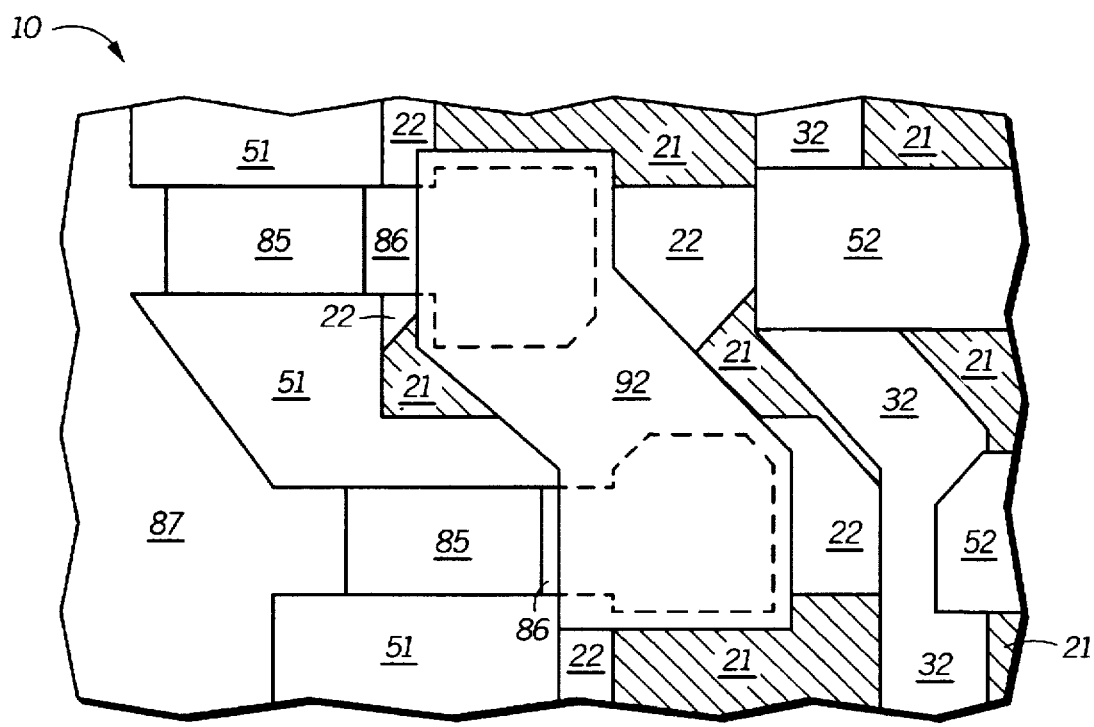
FIG. 10 includes a top view of the substrate of FIG. 9 illustrating the positional relationship between the second plates of the floating storage node capacitors and the memory cell.

FIG. 10 includes a top view of the memory cell 10. FIG. 10 illustrates the positional relationships between field isolation regions 21, active regions 22, word line 32, second conductive members 51 and 52, resistor sections 85, storage node sections 86, and electrode section 87 of the load resistor layer, and third conductive layer 92. For simplicity, none of the insulating layers or sidewall spacers are shown in FIG. 10. The portions of the storage node sections 86 that are covered by the third conductive member 92 are shown by the dashed lines within the third conductive member 92. The electrode section 87 includes a continuous strip along the left-hand side of the memory cell 10, and the resistor sections 85 lie between storage node sections 86 and the electrode section 87.

Figure 11:
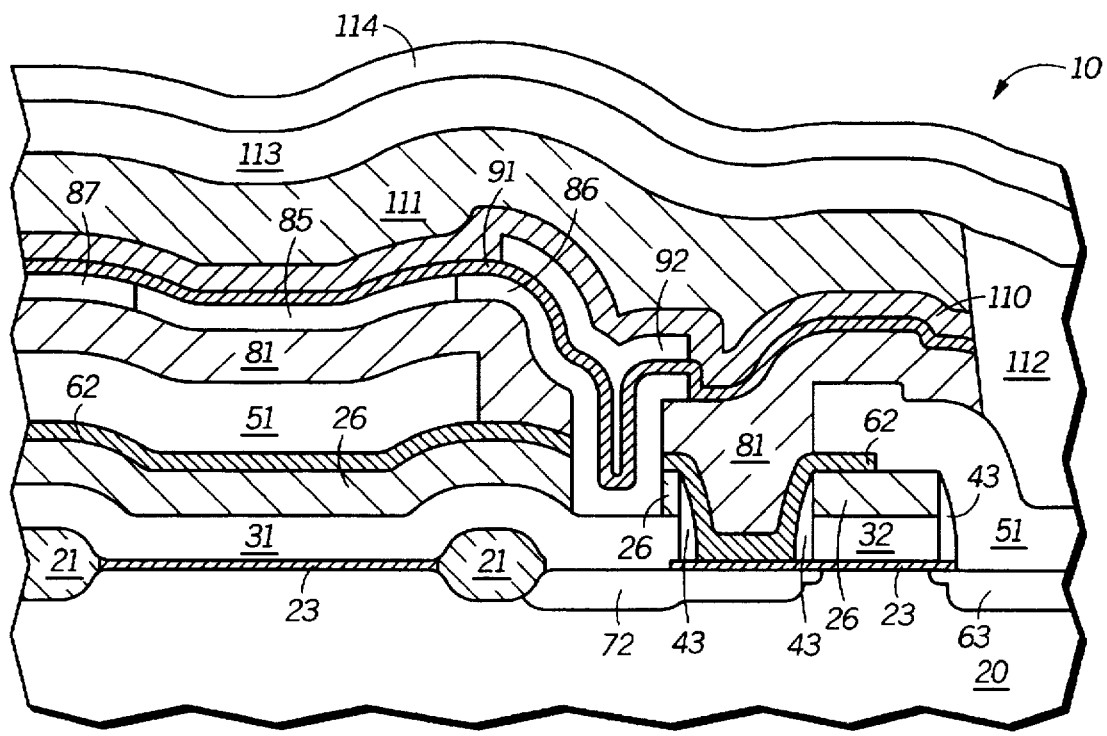
FIG. 11 includes a cross-sectional view of the substrate of FIG. 9 after the fabrication of the memory cell is substantially completed.

An undoped glass layer 110, a borophosphosilicate glass layer 111, contact openings and contacts 112, an interconnecting layer 113, and a passivating layer 114 are formed to finish fabricating the memory cell as shown in FIG. 11. If needed, additional insulating layers, via openings and vias, and additional interconnection levels may also be formed. Conventional methods are used to form the layers, openings, contacts, and vias.

In the finished memory cell electrical connections are made to sense amplifiers, a row decoder, and $V_{SS}$ and $V_{DD}$ electrodes. FIG. 11 illustrates the doped region 63 that is electrically connected to a first bit line (illustrated in FIG. 11 as the interconnecting layer 113 via the contact 112 and one of the second conductive members 52) that is electrically connected to a sense amplifier. Within the memory cell 10, another doped region 63 (not shown) that is also adjacent the word line 32 is electrically connected to a second bit line (not shown) in a manner similar to the first bit line. The word line 32 is connected to a row decoder (not shown). The doped regions 63 that act as the source regions of the latch transistors (illustrated in FIG. 6) contact the second conductive member 51 that is electrically connected to a $V_{SS}$ electrode (not shown), which is at about ground potential when the memory cell is operating. The electrode section 87 is connected to a $V_{DD}$ electrode (not shown), which is at a potential in a range of about 2–5 volts when the cell is operating. The third conductive member 92 is at a potential of about ½ the potential of the $V_{DD}$ electrode because 1) the $V_{SS}$ electrode is at about ground potential and 2) the capacitor plate area for one of the floating node capacitors is about the same as the other floating node capacitor of the memory cell 10.

Benefits and Fabricating Options of the Example

The embodiment described above includes benefits. The embodiment of the example includes additional safety margin should one of the floating node capacitors fail. By failing, it is meant that the floating node capacitor becomes a short circuit or an open circuit. By an open circuit with respect to a failed capacitor, it is meant that the capacitor plates are not significantly electrically or capacitively coupled to one another. If one of the floating node capacitors fails as a short circuit, the other floating node capacitor is still present, but one of its plates would be at about the same potential as the $V_{SS}$ electrode and the other plate would be at about the same potential as the $V_{DD}$ electrode. If one or both floating node capacitors fail open, the memory cell becomes a conventional SRAM cell.

The floating node of the floating node capacitors is about at a potential between the potentials of $V_{DD}$ and $V_{SS}$. For example, if the $V_{DD}$ potential is about 5.0 volts and the $V_{SS}$ potential is at about ground potential, the floating node is at a potential of about 2.5 volts because the capacitor area of the two floating node capacitors is about the same. Therefore, the potential across the ONO layer 91 for either floating node capacitor is about 2.5 volts. The ONO layer 91 may be thinner than a dielectric layer in a stacked capacitor having one plate electrically connected to the $V_{DD}$ and the other plate is electrically connected to the $V_{SS}$ electrode because the ONO layer 91 only needs to be able to support about 2.5 volts as opposed to 5.0 volts for the dielectric layer of the stacked capacitor. The reduced potential across the ONO layer 91 allows the ONO layer 91 to be thinner and also increases the reliability of the floating node capacitors as compared to the stacked capacitor described above.

The floating node capacitors are easy to form and typically do not cause the topography of the memory cell to be significantly changed. The storage node sections 86 of the load resistor layer 82 act as the first plates of the floating node capacitors. The second capacitor plate sections of the third conductive member 92 act as the second plates of the floating node capacitors. The process adds three steps to a conventional SRAM process. The three steps are: 1) depositing the ONO layer 91; 2) depositing a third conductive layer; and 3) patterning the third conductive layer to form the third conductive member 92. The third conductive member 92 is typically far enough away from the contacts 112, so that the contacts should not contact the third conductive member 92 if typical photolithographic tolerances are assumed. The third conductive member 92 does not cause the topology of memory cell to significantly change. Therefore, the memory cell using the floating node capacitors is not likely to cause an additional or more complicated planarization process sequence.

A variety of materials may be used in forming the memory cell. The memory cell may be formed using a substrate that is a monocrystalline material or a substrate that includes a layer of the monocrystalline material over an insulating layer such as silicon dioxide or sapphire, wherein the monocrystalline material includes silicon, germanium, diamond, or III-V semiconductor materials such as gallium arsenide, for example. The conductivity types of the all doped layers and regions may be reversed. The insulating layers and sidewall spacers may include silicon dioxide, silicon oxynitride, or silicon nitride. The ONO layer may be replaced by one or more insulating layers. An insulating layer may be thermally grown or deposited using silicon sources such as TEOS, diethylsilane, silane, disilane, chlorine-silicon compounds, and may be undoped or doped with boron or phosphorous dopants. The sidewall spacer material is typically selected so that it is different from the material of layer adjacent to which the sidewall spacer is formed. One skilled in the art is capable of selecting a sidewall spacer material.

The conductive layers may include doped silicon, a refractory metal or its silicide, a metal or a metal-containing compound, or a combination thereof. The silicon layers may include epitaxial silicon, amorphous silicon, polycrystalline silicon (polysilicon), or a combination thereof. A refractory metal or its silicide may comprise a material including titanium, tungsten, cobalt, molybdenum, tantalum, or the like. The metal or metal-containing compound may include aluminum, gold, copper, titanium nitride, tungsten, or the like. The metal and metal-containing compounds may also include small amounts of silicon.

The placement of the third conductive member 92 with respect to the load resistor layer 82 is not critical. Ideally, the capacitive coupling between the third conductive member 92 and the storage node sections should be maximized, and the capacitive coupling between the third conductive member 92 and the resistors sections 85 or electrode section 87 should be minimized. Still, the third conductive member 92 may lie over parts of the resistor sections 85 or part of the electrode section 87, if needed. The third conductive member 92 should not be placed such that it interferes with a contact that needs to be made to an underlying layer, for example, a bit line contact.

The memory cell of the embodiment of Example 1 may be used with design rules in a range of about 0.25–1.0 micron. One skilled in the art appreciates that the invention may be used with design rules lower than 0.25 micron or greater than 1.0 micron. Each insulating layer has a thickness in a range of about 500–3000 angstroms; and the third conductive layer has a thickness in a range of about 500–3000 angstroms. The load resistors 13 and 16 may have resistances on the order of megaohms to teraohms.

The thickness of the ONO layer may be expressed as its electrically-measured oxide equivalent thickness. For example, a composite layer includes a silicon dioxide layer about 50 angstroms thick and a includes a silicon nitride layer about 100 angstroms thick. The composite layer may have an electrically-measured oxide equivalent thickness of about 100 angstroms. Electrically-measured oxide equivalent thicknesses are known to one skilled in the art and are typically used in conjunction with composite insulating layers that include a plurality of electrically insulating materials such as silicon dioxide and silicon nitride. The ONO layer 33 has an electrically-measured oxide equivalent thickness in a range of about 50–200 angstroms. The ranges of the design rules, thicknesses, etc. are meant to be illustrative and not limiting.

Other Embodiments

Figure 12:
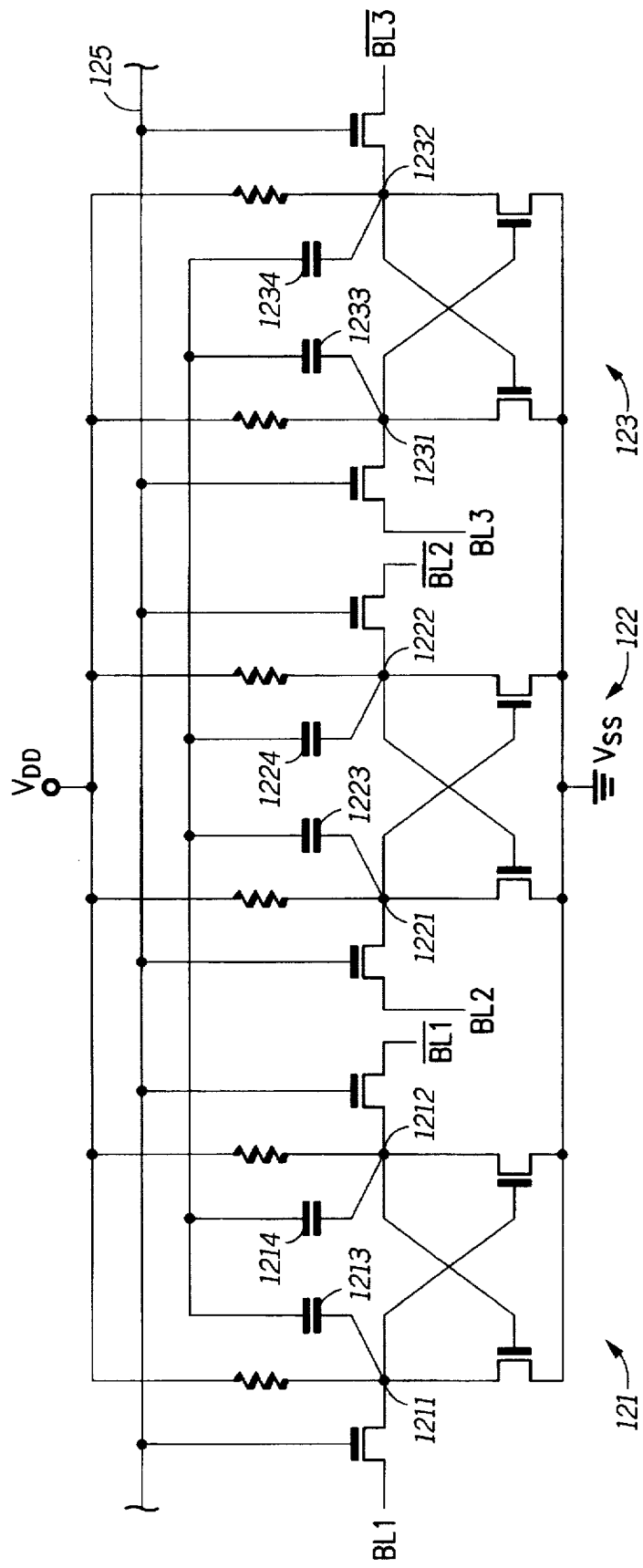
FIGS. 12–14 illustrate other embodiments of the present invention.
Figure 13:
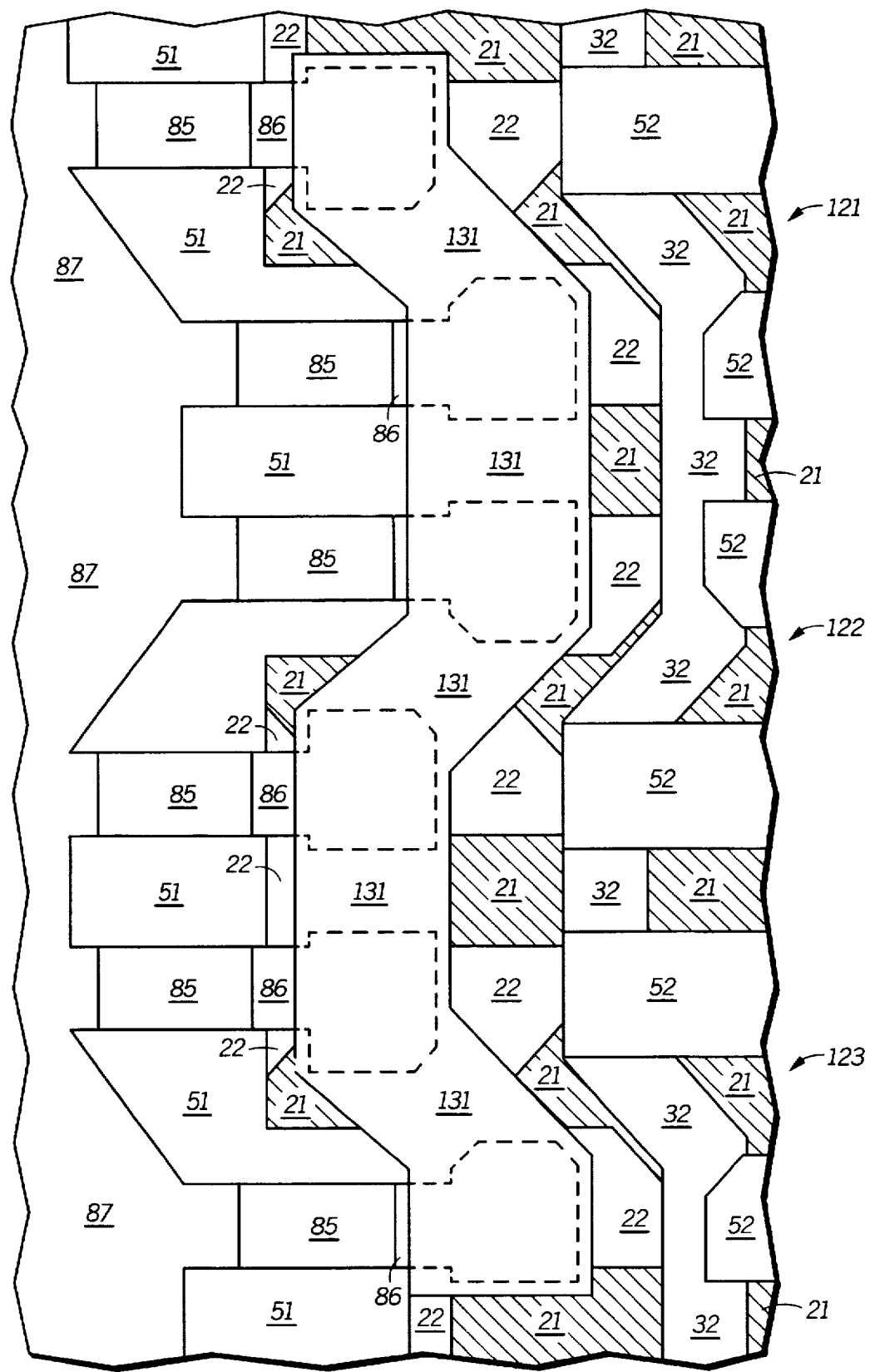

In another embodiment, the second capacitor plates of the floating node capacitors of a SRAM cell may be electrically connected to the second capacitor plates of floating node capacitors of other SRAM cells. FIG. 12 includes a circuit diagram of three SRAM cells 121–123. The SRAM cell 121 includes a first storage node 1211, a second storage 1212, a first floating node capacitor 1213 connected to the first storage node 1211, and a second floating node capacitor 1214 connected to the second storage node. The SRAM cells 122 and 123 have similar elements. FIG. 13 includes a top view of the SRAM cells including a third conductive member 131, which is similar to the third conductive member 92 of the embodiment of the Example except that the third conductive member 131 extends across the three memory cells 121–123. One skilled in the art appreciates that the third conductive member, which acts as the floating node for the storage capacitors, may cover any number of memory cells.

Figure 14:
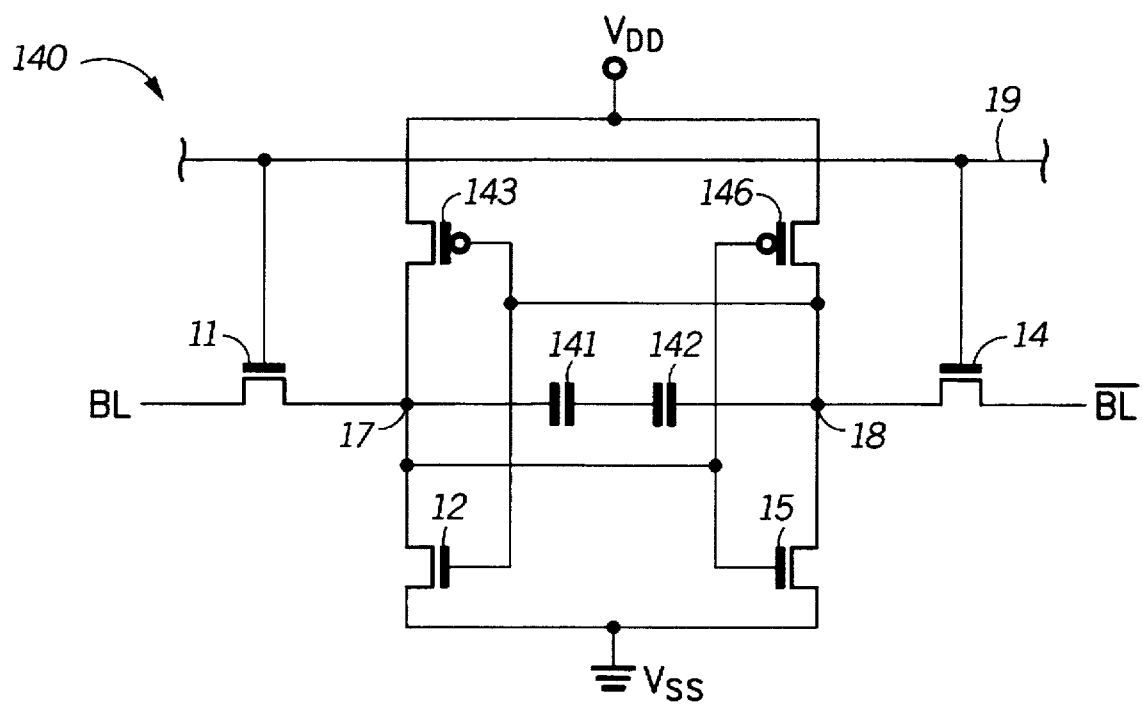

In still another embodiment, the load resistors of the memory cell may be replaced by load transistors as shown in FIG. 14. Referring to FIG. 14, the SRAM cell 140 is similar to the SRAM cell 10 of FIG. 1 except that the load resistors 13 and 16 are replaced by p-channel load transistors 143 and 146, respectively. The gate of the load transistor 143 is connected to the gate of the latch transistor 12, and the gate of the load transistor 146 is connected to the gate of the latch transistor 15. The load transistors 143 and 146 may be thin-film transistors or may be conventional planar or bulk transistors. If the load transistors are p-channel transistors, the storage node sections act as drain regions for the load transistors, and the electrode sections act as the source regions for the load transistors. If the load transistors are n-channel transistors, the storage node sections act as source regions for the load transistors, and the electrode sections act as the drain regions for the load transistors. One skilled in the art appreciates that the floating node capacitors are easily adapted into many types of existing memory cells.

In yet another embodiment, the third conductive member may be doped from a doped glass layer. In this embodiment, the third conductive member 92 is formed by depositing and patterning a layer of undoped silicon. The undoped glass layer 110 is omitted, and the borophosphosilicate glass layer 111 is used to dope the silicon to make the third conductive layer 92 conductive. The dopant content will determine whether the third conductive layer 92 is n-type or p-type. The use of a germanium-silicon compound may be used instead of silicon so that dopants may diffuse throughout the layer at a lower temperature compared to a silicon layer. The ONO layer 91 should prevent dopants from a doped glass layer from reaching the resistor sections 85 of the load resistor layer 82.

In another embodiment, the third conductive layer may be patterned to form a third conductive member that covers the resistor sections 85 of the load resistor layer. The third conductive member may act as a protective layer to reduce the likelihood of further doping of the resistor sections 85 during a subsequent doping step, if a doping step is performed after the third conductive member has been formed.

In the foregoing specification, the invention has been described with reference to specific embodiments thereof. It will, however, be evident that various modifications and changes can be made thereto without departing from the broader spirit or scope of the invention as set forth in the appended claims. The specification and drawings are, accordingly, to be regarded in an illustrative rather than a restrictive sense.

What is claimed is:

1. A semiconductor device including a static-random-access memory cell comprising:

an insulating layer over a semiconductor substrate, wherein the insulating layer has a first opening and a second opening;

a first conductive member, wherein:
   at least a portion of the first conductive member lies along a side of the first opening and acts as a first plate of a first capacitor; and
   the first conductive member is electrically connected to a first doped region with the semiconductor substrate;

a second conductive member, wherein:
   at least a portion of the second conductive member lies along a side of the second opening and acts as a first plate of a second capacitor; and
   the second conductive member is electrically connected to a second doped region with the semiconductor substrate;

a dielectric layer adjacent to the first and second conductive members, wherein the dielectric layer acts as a dielectric for each of the first and second capacitors; and a third conductive member adjacent to the dielectric layer and overlying the semiconductor substrate, wherein:
   portions of the third conductive member act as second plates of the first and second capacitors;
   the first capacitor includes portions of the first conductive member, the dielectric layer, and the third conductive member;
   the second capacitor includes portions of the second conductive member, the dielectric layer, and the third conductive member;
   the first and second capacitors are connected in series between first and second storage nodes of the memory cell; and
   the third conductive member electrically floats.

2. The semiconductor device of claim 1, wherein the first, second, and third conductive members completely lie within the memory cell.

3. The semiconductor device of claim 1, wherein the memory cell further comprises:

a first pass transistor having a first source/drain region, a second source/drain region, and a gate electrode;

a second pass transistor having a first source/drain region, a second source/drain region, and a gate electrode;

a first latch transistor having a source region, a drain region, and a gate electrode;

a second latch transistor having a source region, a drain region, and a gate electrode;

a first component selected from the group consisting of a resistor and a transistor; and a second component selected from the group consisting of a resistor and a transistor, wherein the memory cell is configured such that:

the first pass transistor, the first latch transistor, and the first component are associated with a first storage node;

the second pass transistor, the second latch transistor, and the second component are associated with a second storage node;

the first conductive member is part of an electrical connection between the first storage node and the first component;

the second conductive member is part of an electrical connection between the second storage node and the second component;

the drain region of the first latch transistor, the first component, the second source/drain region of the first pass transistor, and the gate electrode of the second latch transistor are electrically connected to one another; and the drain region of the second latch transistor, the second component, the second source/drain region of the second pass transistor, and the gate electrode of the first latch transistor are electrically connected to one another.

4. The memory cell of claim 3, wherein:

the first source/drain region of the first pass transistor is electrically connected to a first bit line;

the first source/drain region of the second pass transistor is electrically connected to a second bit line;

the source regions of the first and second latch transistors are electrically connected to one another; and the first and second components have electrode sections that are electrically connected to one another.

5. The semiconductor device of claim 1, wherein the third conductive member is not electrically connected to any other part of the semiconductor device.

6. A semiconductor device including a plurality of static-random-access memory cells comprising:

a semiconductor substrate;

first plates of first capacitors, wherein each of the first plates of the first capacitors are electrically connected to a first doped region that is part of a first storage node of one of the memory cells;

first plates of second capacitors, wherein each of the first plates of the second capacitors are electrically connected to a second doped region that is part of a second storage node of one of the memory cells;

a dielectric layer adjacent to the first plates of the first and second capacitors;

a conductive member that lies adjacent to the dielectric layer, overlies the semiconductor substrate, and extends across each memory cell of the plurality of the memory cells, wherein:

portions of the conductive member acts as second plates of the first and second capacitors;

the conductive member electrically floats; and at least two capacitors are connected in series between any two of the first and second storage nodes via the conductive member.

7. The semiconductor device of claim 6, wherein the first capacitors, second capacitors, and conductive member completely lie within a memory array.

8. The semiconductor device of claim 6, further comprising:

first pass transistors each having a first source/drain region, a second source/drain region, and a gate electrode;

second pass transistors each having a first source/drain region, a second source/drain region, and a gate electrode;

first latch transistors each having a source region, a drain region, and a gate electrode;

second latch transistors each having a source region, a drain region, and a gate electrode;

first components selected from the group consisting of a resistor and a transistor; and second components are selected from the group consisting of a resistor and a transistor, wherein each memory cell.

includes one of the first capacitors, one of the second capacitors, one of the first pass transistors, one of the second pass transistors, one of the first latch transistors, one of the second latch transistors, one of the first components, one of the second components, a first storage node, and a second storage node; and is configured such that:

its first pass transistor, its first latch transistor, and its first component are associated with its first storage node;

its second pass transistor, its second latch transistor, and its second component are associated with its second storage node;

the first plate of its first capacitor is part of an electrical connection between its first storage node and its first component;

the first plate of its second capacitor part of an electrical connection between its second storage node and its second component;

the drain region of its first latch transistor, its first component, the second source/drain region of its first pass transistor, and the gate electrode of its second latch transistor are electrically connected to one another; and the drain region of its second latch transistor, its second component, the second source/drain region of its second pass transistor, and the gate electrode of its first latch transistor are electrically connected to one another.

9. The plurality of memory cells of claim 8, wherein:

the first source/drain regions of the first pass transistors are electrically connected to first bit lines;

the first source/drain regions of the second pass transistors are electrically connected to second bit lines;

the source regions of the first and second latch transistors are electrically connected to one another; and the first and second components have electrode sections that are electrically connected to one another.

10. The semiconductor device of claim 6, wherein the conductive member is not electrically connected to any other part of the semiconductor device.

11. The semiconductor device of claim 6, wherein all of the first and second capacitors overlie the semiconductor substrate.

12. A static-random-access memory cell comprising:

spaced-apart doped regions within a semiconductor substrate;

a gate dielectric layer overlying the semiconductor substrate;

first conductive members overlying the semiconductor substrate, wherein:
the first conductive members act as gate electrodes for latch and pass transistors; and
each of the first conductive members overlies portions of at least two of the spaced-apart doped regions;
an insulating layer overlying the first conductive members;
a first load component overlying the insulating layer, wherein the first load component includes a first storage node section that acts as a first plate of a first capacitor;
a second load component overlying the insulating layer, wherein the second load component includes a second storage node section that acts as a first plate of a second capacitor;
a capacitor dielectric layer overlying the first and second storage node sections; and
a second conductive member overlying the capacitor dielectric layer, wherein:
portions of the second conductive member are second plates of the first and second capacitors; and
the second conductive member electrically floats,
wherein the memory cell is configured such that:
the first capacitor includes the first storage node section, the capacitor dielectric layer, and a portion of the second conductive member;
the second capacitor includes the second storage node section, the capacitor dielectric layer, and another portion of the second conductive member that is different from the portion of the second conductive member that is part of the first capacitor and
the first and second capacitors are electrically connected in series between first and second storage nodes of the memory cell.

13. The memory cell of claim 12, wherein the capacitor dielectric layer comprises oxide and nitride.

14. The memory cell of claim 12, wherein:
the first and second storage node sections include silicon; and
the first conductive members include a metal-containing material.

15. The memory cell of claim 12, wherein the capacitor dielectric layer has an electrically measured oxide equivalent thickness in a range of about 50–200 angstroms.

16. The memory cell of claim 12, wherein the first and second load components are selected from a group consisting of load resistors and load transistors.

17. The memory cell of claim 16, further comprising a phosphorus-containing glass layer lying on the second conductive member.

18. A static-random-access memory array comprising:
a semiconductor substrate;
first doped regions and second doped regions within the semiconductor substrate; and
a plurality of capacitors each having a first plate, a dielectric layer, and a second plate, wherein:
the plurality of capacitors overlies the semiconductor substrate;
each of the first plates are electrically connected to one of the first and second doped regions;
the second plates are part of a conductive strip that electrically floats; and
two capacitors of the plurality of capacitors are connected in series between any one of the first doped regions and any one of the second doped regions.

19. The memory array of claim 18, wherein:
the memory array includes a first memory cell and a second memory cell;
each of the first and second memory cells has one of the first doped regions and one of the second doped regions; and
the memory array is configured such that:
between the first doped region of the first memory cell and the first doped region of the second memory cell, at least two capacitors of the plurality of capacitors are connected in series; and
between the first doped region of the first memory cell and the second doped region of the second memory cell, at least two capacitors of the plurality of capacitors are connected in series.

20. The memory array of claim 18, wherein:
the memory array includes a first number of memory cells;
each of the memory cells has one of the first doped regions and one of the second doped regions; and
the plurality of capacitors has a second number of capacitors, wherein:
the second number is twice the first number;
between any two first doped regions within the memory array, two capacitors are connected in series;
between any two second doped regions within the memory array, two capacitors are connected in series;
between any one of the first doped regions and any one of the second doped regions, two capacitors are connected in series; and
each of the capacitors within the plurality of capacitors are only connected to: 1) one of the first and second doped regions, and 2) all other capacitors of the plurality of capacitors.

* * * * *

UNITED STATES PATENT AND TRADEMARK OFFICE
CERTIFICATE OF CORRECTION

PATENT NO. : 5,739,564
DATED : April 14, 1998
INVENTOR(S) : Yasunobu Kosa et al.

It is certified that error appears in the above-identified patent and that said Letters Patent is hereby corrected as shown below:

In claim 8, column 12, line 34;
    after "capacitor", insert - -is- -.

In claim 12, column 13, line 32;
    after "capacitor", insert - -;- -.

Signed and Sealed this

Fourth Day of May, 1999

Attest:

Attesting Officer

Q. TODD DICKINSON

Acting Commissioner of Patents and Trademarks